United States Patent [19]

Takahashi et al.

[11] Patent Number: 4,768,702
[45] Date of Patent: Sep. 6, 1988

[54] DIE BONDING APPARATUS

[75] Inventors: Michio Takahashi; Shinichi Arai; Tooru Mita; Tatsuhiro Suzuki, all of Yokohama, Japan

[73] Assignee: Hitachi, Ltd., Tokyo, Japan

[21] Appl. No.: 42,705

[22] Filed: Apr. 27, 1987

[30] Foreign Application Priority Data

Apr. 30, 1986 [JP] Japan .................................. 61-98163

[51] Int. Cl.⁴ .............................................. B23K 20/02
[52] U.S. Cl. ...................................... 228/5.5; 228/44.7
[58] Field of Search ......................... 228/5.5, 106, 44.7

[56] References Cited

U.S. PATENT DOCUMENTS

| | | | |
|---|---|---|---|
| 3,574,923 | 4/1971 | Cushman | 228/106 |
| 3,608,809 | 9/1971 | Cushman | 228/5.5 |
| 3,790,738 | 2/1974 | Laub et al. | 228/5.5 |
| 4,638,937 | 1/1987 | Belanger | 228/5.5 |

FOREIGN PATENT DOCUMENTS 37842 3/1982 Japan .

Primary Examiner—Kenneth J. Ramsey
Attorney, Agent, or Firm—Antonelli, Terry & Wands

[57] ABSTRACT

As a die bonding apparatus for establishing electrical connection between electrodes on one side of a semiconductor chip and associated electrodes on a package comprises a pair of pinching and pressing mechanisms having a pair of pinching and pressing surfaces adapted to be moved closer relative to each other and so as to pinch and press semiconductor chip and package and at least one remote center mechanism provided in at least one of the pair of pinching and pressing mechanisms, in such a manner that a remote center thereof is positioned in the pinching and pressing surface of above-mentioned one pinching and pressing mechanism, for adjusting orientations of the pair of pinching and pressing surfaces to make the orientations thereof correspond to those of both surfaces of the semiconductor chip and the package at the time of the pressing and pinching operation all of the electrodes on one side of the semiconductor chip are thereby uniformly pressed against the corresponding electrodes on the package without any laterally shifting movement thereof even if the chip is inclined relative to the package because the sizes of bumps of the electrodes on the chip are not constant.

8 Claims, 9 Drawing Sheets

FIG. 19
FIG. 20
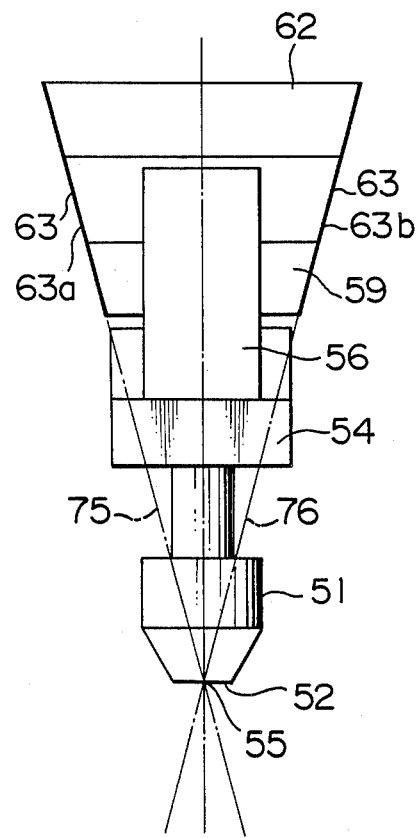
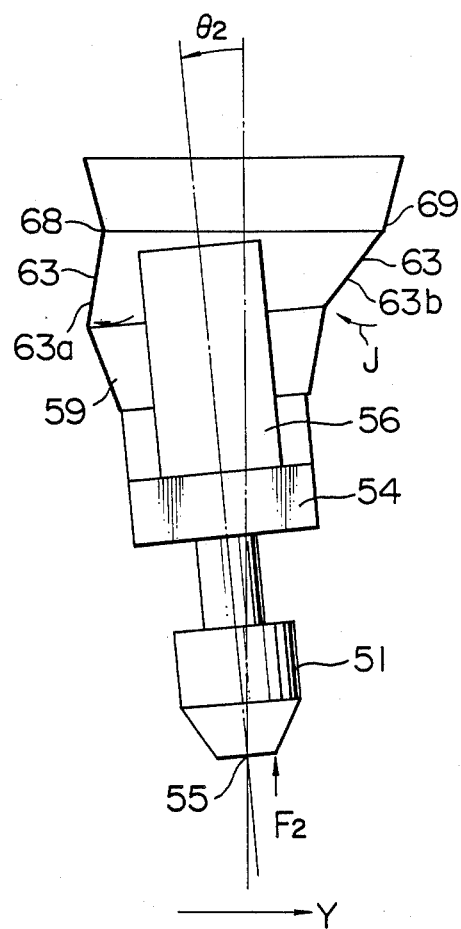

DIE BONDING APPARATUS

BACKGROUND OF THE INVENTION

1. Field of the Invention

This invention relates to a die bonding apparatus for electrically connecting the electrodes on the die or semiconductor chip with the corresponding electrodes or leads of the package body etc. by heating under pressure, and more particularly to a face bonding apparatus for establishing electrical connection of a plurality of electrodes on one side of a semiconductor chip with a plurality of electrodes on the package body by pressing these elements against each other under the application of heat. More specifically, this invention relates to a die bonding apparatus suitable for mounting or packaging the semiconductor chip based on the TAB (tape automated bonding) method.

2. Description of the Prior Art

FIG. 11 shows an example of a well known type of die bonding apparatus having a pressing and heating tool 1 that is provided as one of pinching and pressing means and which vertically moves along guide bars 7 while being supported thereon by bearings 6, the guide bars 7 standing vertically and being fixed on a base 5 provided as the other one of the pinching and pressing means. When this pressing and heating tool 1 is moved down along the guide bars 7, it presses a silicon chip 2 at its lower surface 1a formed as a pinching and pressing surface, as indicated by the broken line in the drawing. The opposite ends of the silicon chip 2 are placed on the bumps 3 at the inner ends of two wiring members 4 disposed on a surface 5a of the base 5 which serves as a pinching and pressing surface. The wiring members 4 and the silicon chip 2 are electrically connected in this manner.

If, in this type of conventional bonding apparatus, the lower surface 1a of the pressing and heating tool 1 and the upper surface (opposed surface) 2a of the silicon chip 2 are not parallel with each other as shown in FIG. 12, the pressure applied by the tool 1 on the chip 2 is not uniformly distributed over the chip 2, resulting in the variation in the strength of the connection between each of the wiring members 4 and the corresponding electrode part on the silicon chip 2. Moreover, if the two opposed surfaces 1a, 2a are at such states where the deviation from parallelism therebetween is significant, a gap 9 may be formed between the silicon chip 2 and the pressing and heating tool 1 so that there is a possibility of failure in the contact between the silicon chip 2 and the connecting bumps 3 after these members have been pressed.

The deviation from the parallelism between the lower surface 1a of the tool 1 and the opposed surface 2a of the chip 2 may be increased not only when, as shown in FIG. 12, the sizes (heights) of the left and right bumps 3 as a whole are different from each other so that the silicon chip 2 is inclined on the bumps 3 (normally 20 to 30 $\mu$ in height in the case of a 80 $\mu$ square), but also when the thickness of the chip 2 is not uniform or when a foreign particle enters between the chip and the wiring members. Also it may be increased by an dimensional error on the side of the tool 1 which will result in an inclination of the lower surface 1a of the tool 1 relative to a virtual plane perpendicular to that of the translation of the tool 1.

Japanese Patent Application Laid-Open No. 37842/1982 discloses a die bonding apparatus, for the purpose of eliminating these problems, which has a mechanism constituted by spherical sliding portions whereby the plane defined by the bumps on a semiconductor chip is adjusted to be parallel with the surface of the tool.

The apparatus disclosed in Japanese Patent Laid-Open No. 37842/1982 is constituted as shown in FIG. 13. A pressing and heating tool 101 constituting one of the pinching and pressing means is moved in the direction indicated by the reference numeral 111 down onto a semiconductor chip 102 so as to press patterns 107 formed on tapes 108 against bumps 103 formed on the surface of the semiconductor chip 102. If at this time the bumps 103 are not of the same heights to define a plane parallel with the chip surface, in other words, the lower surface (pinching and pressing surface) 101a of the tool 101 is not parallel with the surface of the semiconductor chip 102, a ball 105 slidingly moves along the spherical contact surface 112 of a ball receiving member 106 and swings so that the pressure applied to each of the patterns 107 and to each of the bumps 103 is equalized.

After the plane defined by the bumps 103 have been made parallel with the lower surface 101a of the tool 101 by the rotational displacement of the ball 105 and after the patterns 107 and the bumps 103 are pressed together, the tool 101 is heated, thereby connecting the patterns 107 to the bumps 103. Incidentally, the apparatus has an heat insulation member 104 provided as the other one of the pinching and pressing means and a base 110.

The apparatus shown in FIG. 13 has the following problems:

(1) Since the center A of the sphere of the spherical seat 112 is remote from the lower surface 101a of the tool 101 or the surfaces of the chip 102, there are displacements of the bumps 103 not only in the vertical direction but also in the horizontal direction when the ball 105 is rotationally displaced about the center A. Therefore there is a possibility of failure in the electrical connection between the bumps 103 and the associated leads 107.

(2) ⓐ When the spherical surface 112 is formed by as a sliding surface, the friction between the spherical sliding surfaces would become substantial, which would be inappropriate for correcting the delicate uneven abutment caused by a relatively small deviation from the parallelism between the lower surface 101a of the tool 101 and upper surface defined by the conductors 107 or bumps 103.

ⓑ If the spherical seat 112 is designed to provide rolling contact, the mass of the moving parts is increased so large that this mechanism cannot always effect suitable aligning operation because of the increased inertia when the bonding apparatus is to be operated at high speed.

ⓒ In any case, the number of parts or components for the apparatus is increased, resulting in a high production cost.

(3) There is a possibility that the ball 105 is freely turned about a vertical line including the point A relative to the ball receiver 106. It is therefore difficult to position the chip 102 accurately.

SUMMARY OF THE INVENTION

An object of the present invention is to provide a bonding apparatus capable of eliminating at least one of the above-mentioned problems in the prior art apparatus and of enhancing the strength or reliability of electrical connections as well as expanding the applicability of the apparatus so that it can be utilized even when the size of the bumps or connecting pads is reduced.

To this end, the present invention provides in one of its aspects a die bonding apparatus for establishing electrical connection between a plurality of electrodes disposed on one side of a semiconductor chip and a plurality of associated or corresponding electrodes on a package by pressing the electrodes against each other, the apparatus comprising: a pair of pinching and pressing mechanisms having a pair of pinching and pressing surfaces adapted to be moved closer or approached relative to each other so as to pinch and press the semiconductor chip and the package therebetween; and at least one remote center or aligning mechanism provided in at least one of the pair of pinching and pressing mechanisms, in such a manner that a remote center thereof is positioned in the pinching and pressing surface of said one pinching and pressing mechanism, for adjusting orientations of the pair of pinching and pressing surfaces to make the orientations correspond to those of both surfaces of the semiconductor chip and the package at the time of the pressing and pinching. In one preferred embodiment of the die bonding apparatus according to the present invention, the remote center mechanism has at least one parallelogram link mechanism in such a manner that the remote center is constantly positioned in the pinching and pressing surface of said one pinching and pressing mechanism.

In one preferred embodiment of the die bonding apparatus according to the present invention, the remote center mechanism has a first pair of parallelogram link mechanisms operative in a first plane, each of the first pair of parallelogram link mechanisms being connected at its one side to a base of one of the pinching and pressing mechanisms and connected at a side, opposed to said one side, to a pinching and pressing portion on which the pinching and pressing surface of the pinching and pressing mechanism is formed.

In a preferred embodiment of a die bonding apparatus according to the present invention, a second pair of parallelogram link mechanisms operative in second planes perpendicular to the first plane are connected to the opposed sides of the first pair of parallelogram link mechanisms.

In an other preferred embodiment of a die bonding apparatus according to the present invention the remote center or aligning mechanism has at least one four-sides or quadrilateral link mechanism adapted to have an instantaneous or virtual center thereof positioned in the pinching and pressing surface said one pinching and pressing mechanism when the remote center mechanism is set substantially at or near a balanced position thereof.

In a first example of this type, the remote center mechanism has a first pair of quadrilateral link mechanisms operative in a first plane, each of the first pair of quadrilateral link mechanisms being connected at its one side to a holder for supporting the link mechanism and connected, at a side opposed to said one side, to a pinching and pressing portion on which the pinching and pressing surface of the pinching and pressing mechanisms is formed.

In a second example of this type, the remote center mechanism is constituted by a first quadrilateral link mechanism which is operative in a first plane and whose instantaneous center is positioned in the pinching and pressing surface of said one pinching and pressing mechanism when being substantially at or near a balanced position thereof, and a second quadrilateral link mechanism which is operative in a second plane perpendicular to the first plane and whose instantaneous center is positioned in the pinching and pressing surface of said one pinching and pressing mechanism when being substantially at or near a balanced position thereof. In a preferable form of this example, each of the quadrilateral link mechanism is constituted by two rigid body pieces having different lengths and two resilient pieces connected to the rigid pieces at corresponding ends thereof, and wherein virtual lines extended along longitudinal directions of the resilient pieces in each of the quadrilateral link mechanism passing through the connected ends thereof intersect each other in the vicinity of said one of the pinching and pressing surfaces so that the instantaneous remote center can be situated on said one surface.

Each pinching and pressing mechanism may have each remote center mechanism having a remote center at each pinch and press surface.

The above-mentioned and other features of the present invention will be made clearer by the description hereinafter with reference to the accompanying drawings.

BRIEF DESCRIPTION OF THE DRAWINGS

FIG. 19 is a schematic front view of the pinching and pressing mechanism shown in FIG. 16; and FIG. 20 is a schematic front view of the pinching and pressing mechanism in the state shown in FIG. 18.

DETAILED DESCRIPTION OF THE PREFERRED EMBODIMENTS

A preferred embodiment of the present invention will be described below with reference to FIGS. 1 and 2.

Figure 1:
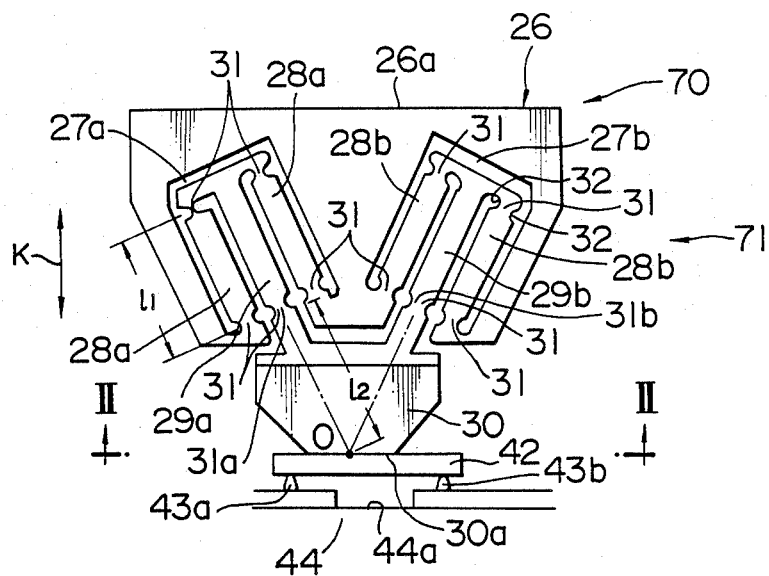
FIG. 1 is a front view of a die bonding apparatus according to one embodiment of the present invention.
Figure 2:
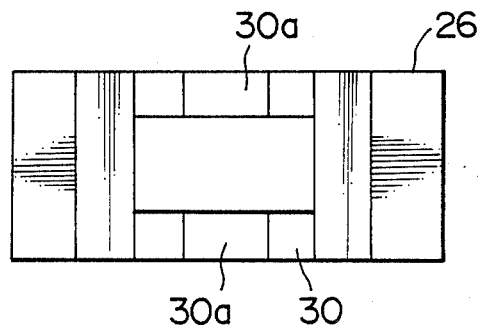
FIG. 2 is an explanatory view of the apparatus of FIG. 1 along the line II—II of FIG. 1.

As shown in FIGS. 1 and 2, a remote center or aligning mechanism 26 has a main body 26a formed with two sets of rectangularly extended apertures or channels 27a and 27b in such a manner as to be oppositely inclined relative to each other. The main body 26a is supported by a vertical drive mechanism (not shown) so as to be movable in the direction indicated by a reference symbol K. The remote aligning mechanism 26 also has two pairs of parallel parts 28a and 28b each of which are spaced apart from and parallel with each other. The parallel parts 28a and 28b are positioned in the channels 27a and 27b respectively with gaps left therearound, and are connected at their lower ends to the main body or holder 26a. Two intermediate parts 29a and 29b are interposed between the parallel parts 28a and 28b respectively with gaps left therebetween in such a manner that the point 0 of intersection of the center lines of these parts 29a and 29b corresponds to an instantaneous center 0 on the lower end face 30a constituting a pinching and pressing surface of the pressing and heating tool or jig 30. The upper ends of these intermediate parts 29a and 29b are connected to the parallel parts 28a and 28b. The pressing and heating tool 30 is connected at its upper end to the lower ends of the intermediate parts 29a and 29b.

The parallel parts 28a and 28b and the intermediate parts 29a and 29b can be rotationally or pivotally displaced about ten nodes 31 each formed of semi-circular grooves 32 at both sides thereof to be narrowed in the widthwise direction. The nodes 31 are situated at the upper and lower ends of the parallel parts 28a and 28b and at the lower ends of the intermediate parts 29a and 29b. In this embodiment, the aligning mechanism 26 and the tool 30 constitute a pinching and pressing mean 70.

The length $l_1$ of each of the parallel parts or links 28a and 28b are equal to each other and also equal to the distance $l_2$ between the point 0 and each of the lower node portions 31a and 31b of the intermediate parts 29a and 29b. In FIG. 1, a reference numeral 44 denotes a base provided as another pinching and pressing means. the upper surface 44a of the base 44 serves as another pinching and pressing surface.

The operation of the die bonding apparatus 71 in accordance with the first embodiment of the present invention thus constructed is explained hereinafter. The point of intersection of the center-lines of the intermediate parts 29a and 29b and the lower end surface 30a of the pressing and heating tool 30 is assumed to be the instantaneous center point 0. If the lower end surface 30a of the pressing and heating tool 30 is inclined due to the unevenness in the levels or heights of the bumps for electrical connection 43a and 43b or due to other factors, the right intermediate part 29a and the left intermediate part 29b are rotationally displaced about the nodes 31 by the same angle and each of parallel pairs 28a and 29a are rotationally displaced about their lower nodes 31 by the same angle, so that the inclination of the pressing and heating tool 30 is absorbed or compensated by the rotational displacements without displacing the instantaneous center point 0 thereof. Thus the pressing and heating tool 30 or lower surface 30a thereof can be inclined or oriented by following the inclination or orientation of a silicon chip 42 or an upper surface thereof without displacing the instantaneous center point 0 of the tool 30.

The remote center mechanism 26 shown in FIGS. 1 and 2 may, for example, be constructed by forming grooves in a steel plate by means of electric discharge machining. The parallelogram link mechanism shown in FIG. 1 may be constituted by rods and pins pivotally connecting the rods. In that case, elastic members such as springs may be disposed in order to enable the link mechanism to return to the initial state.

In the die bonding apparatus in accordance with an embodiment of the present invention, a pinching and pressing mechanism 72 such as shown in FIGS. 3 to 9 may be used instead of the pinching and pressing mechanism 70 shown in FIGS. 1 and 2.

Figure 3:
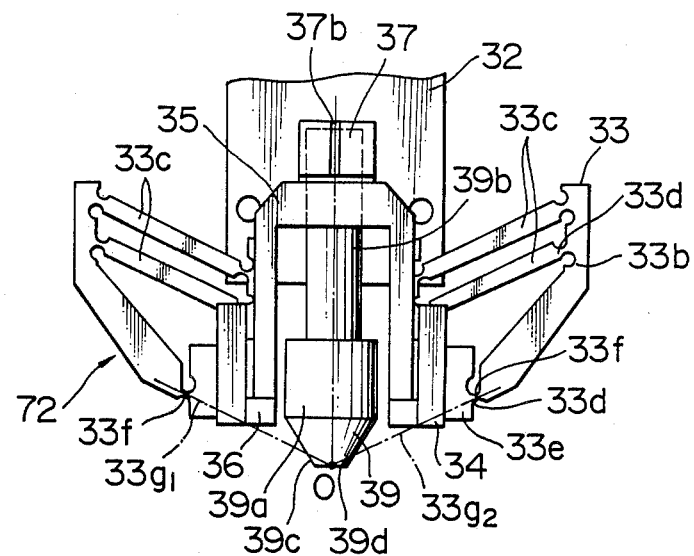
FIG. 3 is a front view of a die bonding apparatus according to another embodiment of the present invention.

In the FIGS. 3 to 9, reference numeral 32 represents a fixing plate which is formed to be moved in the vertical direction by a vertical drive mechanism (not shown). A larger remote center or aligning mechanism 33 is fixed to a lower portion of the fixing plate 32. The remote aligning mechanism 33 is constituted by generally U-shaped inner rigid links 33a fixed to the lower portion of the plate 32, a pair of outer rigid links 33b which are disposed at the opposite sides of the inner rigid links 33a such as to be spaced apart from each other and whose lower portions $33b_1$ are bent inwardly, four parallel parts 33c which are connected at their opposed ends by rotational nodes 33d to the opposite side surfaces of the inner rigid links 33a and to the upper inner opposed surfaces of the pair of outer rigid links 33b, and a pair of couplers 33e which are connected to the lower ends of the outer rigid links 33b through rotational nodes 33f. Incidentally, as shown in FIG. 3, the lines $33g_1$ and $33g_2$ which extend from the centers the nodes 33f rotationally or pivotally connecting the lower portions $33b_1$ of the pair of outer rigid links 33b with the pair of couplers 33e and which are parallel with the parallel parts 33c intersect with each other at a point 0 corresponding to the instantaneous center point 0 on the lower end surface 39d of the bonding die 39 which is described later.

The lengths of the lines $33g_1$ and $33g_2$ (distance between the center of rotation 33f at each side and the point of intersection 0) are equal to the length of each parallel part 33c between nodes 33d associated therewith.

Figure 4:
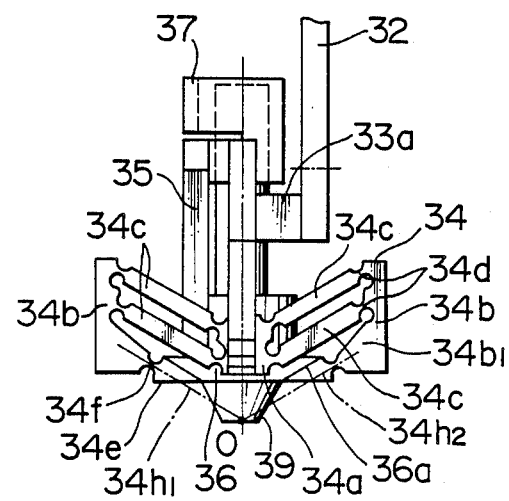
FIG. 4 is a side view of the apparatus shown in FIG. 3;.
Figure 5:
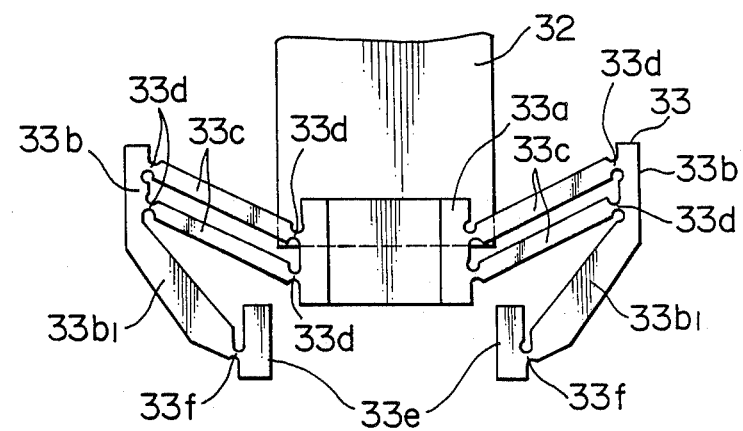
FIG. 5 is a front view of a larger one of remote center mechanisms of the apparatus shown in FIGS. 3 and 4.
Figure 6:
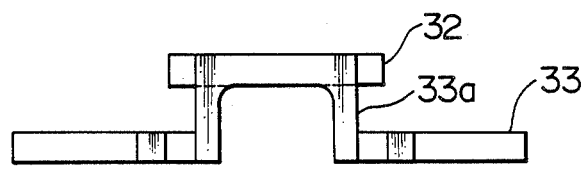
FIG. 6 is a bottom view of the mechanism shown in FIG. 5.
Figure 7:
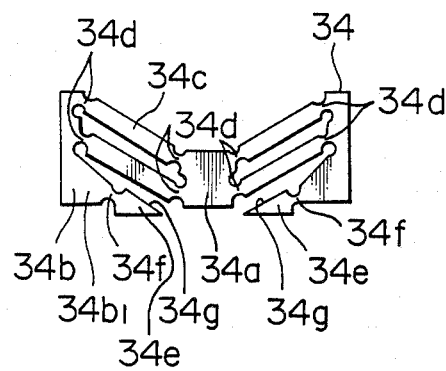
FIG. 7 is a front view of a smaller one of the remote center mechanisms of the apparatus shown in FIGS. 3 and 4.
Figure 8:
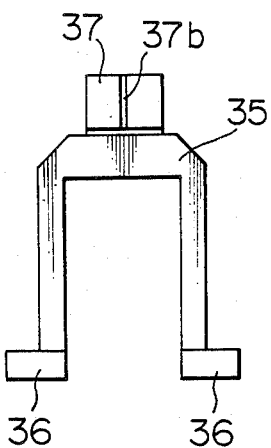
FIG. 8 is a front view of a support member of the apparatus shown in FIGS. 3 and 4.
Figure 9:
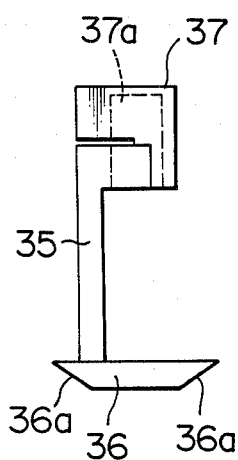
FIG. 9 is a side view of the support member shown in FIG. 8.

A pair of smaller remote center or aligning mechanisms 34 are disposed parallel with and spaced apart from each other at conditions to be perpendicular to the larger remote center or aligning mechanism 33. Each of the smaller remote center mechanisms 34 is constituted by an inner rigid link 34a fixed to the inner opposed surface of corresponding one of the couplers 33e, a pair of outer rigid links 34b which are disposed at the opposite sides of the inner rigid link 34a to spaced part therefrom and whose inner lower opposed portions $34b_1$ project inwardly, four parallel parts 34c which are connected at their opposed ends by rotational nodes 34d to the opposite side surfaces of the inner rigid links 34a and to the upper inner opposed surfaces of the outer rigid links 34b, and a pair of couplers 34e which are connected at their outer ends to the lower ends 34$b_1$ of the outer rigid link 33b by means of rotational nodes 34f and which have tapered surfaces 34g formed at their inner portions. Incidentally, as shown in FIG. 4, the lines 34$h_1$ and 34$h_2$ which extend from the centers the nodes 34f rotationally connecting the lower portions 34$b_1$ of the pair of outer rigid links 34b with the pair of couplers 34e and which are parallel with the parallel parts 34c intersect with each other at the point 0 corresponding to the instantaneous center point 0 on the lower end surface 39d of the bonding die 39. The lengths of the lines 34$h_1$ and 34$h_2$ (distance between the center of rotation 34f at each side and the point of intersection 0) are equal to the length of each parallel part 34c between the nodes 34d associated therewith.

A support member 35 is provided generally in an U-shaped form. Holders 36 which have tapered surfaces 36a to be contacted and fixed with the tapered surfaces 34g of the couplers 34e of the smaller remote aligning mechanisms respectively are fixed to the lower ends of the support member 35.

A fastening structure 37 is provided generally in an inverted L-shaped form. A lower part of the fastening structure 37 is integrally formed with the side of an upper portion of the support member 35. The fastening structure 37 has a bore 37a into which an upper shaft portion 39b of the bonding die 39 is fitted, and a slot 37b which extends from the bore 37a to the outside and to the top end of the fastening structure 37. The width of the slit 37b is reduced when fastened by a set-screw 38 screwed in the direction perpendicular to the longitudinal direction of the slit 37b, thereby fixing the upper shaft portion 39b of the bonding die 39 to the support member 35.

The bonding die 39 includes at its lower portion a head 39a having symmetrical tapered surfaces 39c at lower opposite side thereof, and the shaft portion 39b extending upwardly from the head 39a and fixed to the support member 35 at the upper end thereof through the fastening structure 37. The bonding die 39 serving as one of the pinching and pressing mechanisms is designed to press connection bumps (not shown) at its lower surface 39d.

The pinching and pressing mechanism 72 of die bonding apparatus in accordance with the second embodiment of the present invention thus constructed is operated as follows. After the upper shaft portion 39b of the bonding die 39 has been fitted into the bore 37a of the fastening structure 37 and fixed by the set-screw 38, the bonding die 39 is moved downward together with the plate 32, the remote center mechanisms 33 and 34 and support member 35 by the vertical drive mechanism (not shown). If, when the bonding die 39 is brought into contact with the silicon chip, an orientation of the silicon chip is inclined due to unevenness in heights of the connection bumps (not shown) which contact the lower surface of the chip at the opposite end thereof, the bonding die 39 can follow the inclined orientation of the silicon chip by the effect the pairs of remote center or aligning mechanisms 33 and 34 to be correspondingly inclined without displacing its instantaneous center 0.

Figure 10:
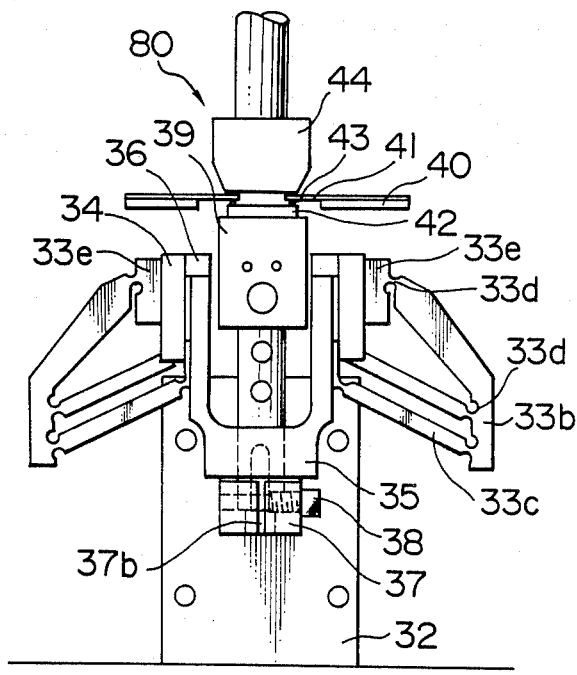
FIG. 10 is a front view of a die bonding apparatus according to still another embodiment of the present invention.
Figure 11:
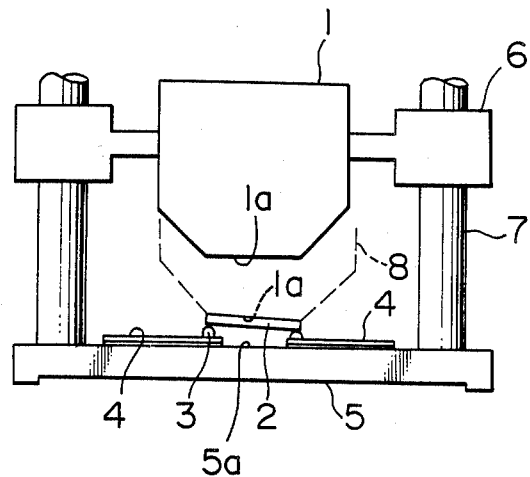
FIG. 11 is a front view of a conventional type of bonding apparatus.
Figure 12:
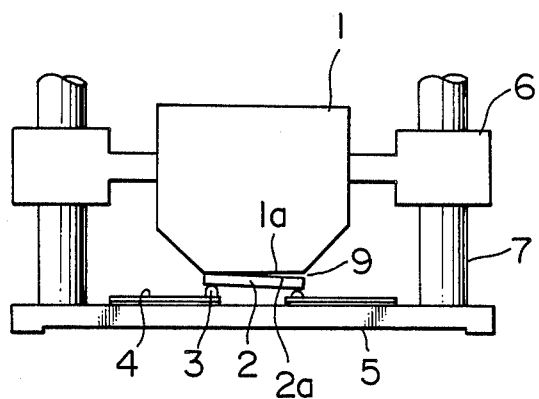
FIG. 12 is a front view of the conventional bonding apparatus shown in FIG. 11 when the apparatus presses a silicon chip.
Figure 13:
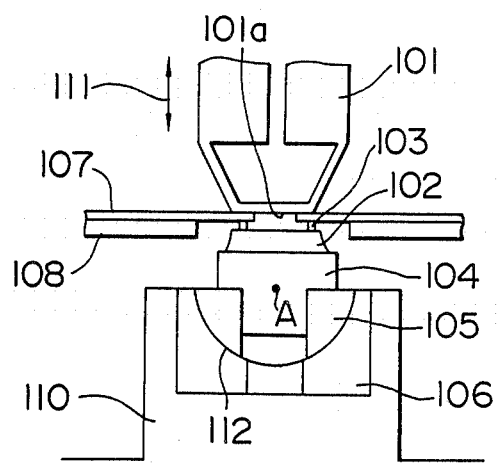
FIG. 13 is a front view of a part of another conventional bonding apparatus.

FIG. 10 shows a still another embodiment of the present invention.

Referring to FIG. 10, a die bonding apparatus 80 for connecting leads 41 on a tape 40 to an IC chip 42 through the bumps 43 is disposed in the form upside down relative to the one shown in FIGS. 3 to 9. This arrangement of the bonding apparatus 80 may be applied when, for example, a space above the leads 41 is so narrow that the bonding apparatus as shown in FIGS. 3 to 9 cannot be used. Since almost all of the components of the apparatus 80 shown in FIG. 10 are the same as those shown in FIGS. 3 to 9, they are indicated by the same reference numerals.

The difference between the embodiment shown in FIG. 10 and that shown in FIGS. 3 to 9 lies only in that the former is provided with a bonding tool 44 serving as a stiffening plate or another of the pinching and pressing mechanisms.

As explained hereinbefore, in the bonding apparatus in accordance with the present invention, the orientation of the pinching and pressing surface can be changed by the effect of the remote center or aligning mechanism whose remote center is located in the pinching and pressing surface, thereby eliminating the need for the adjustment of parallelism and enabling connection members or bumps to be uniformly pressed even when there is a certain degree of unevenness in heights of the bumps. It is thereby possible to enhance the reliability in the strength of the electrical connection.

Since, in the apparatus in accordance with the present invention, the remote center is located in the pinching and pressing surface, there is no lateral movement of this surface when the orientation thereof is changed. Therefore, a connection pad or bump having a smaller size can be also used without any risk of disconnection due to positional displacement, thus enhancing the applicability.

Although the pinching and pressing mechanism having the remote center mechanism is designed to press on the IC chip while the leads or tape is supported by the support or stiffening plate, the pinching and pressing mechanism having the remote center mechanism may be designed to press on the leads or tape while supporting the IC chip by the support or stiffening plate.

Figure 14:
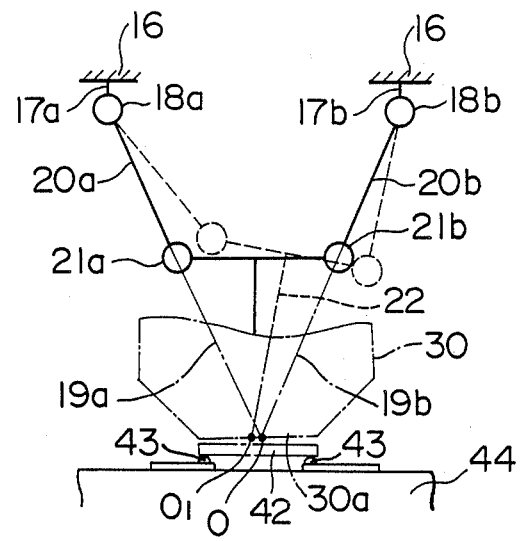
FIG. 14 is an explanatory view of an example of a principle of a remote center mechanism of an embodiment of the die bonding apparatus in accordance with the present invention.

The function of the remote center mechanism for one of the pinching and pressing means of the die bonding apparatus in accordance with the present invention can be realized so long as the instantaneous center point is located, for example, in the front end surface 30a of the bonding die 30 when the mechanism is nearly balanced. As shown in FIG. 14, this type of remote center mechanism comprises, in principle, a four-node link mechanism having a pair of static rigid body links 17a and 17b spaced from each other and fixed to a support 16 at upper ends thereof, a pair of rigid body links 20a and 20b which are respectively connected to the lower ends of the pair of static rigid body links 17a and 17b by means of rotational node 18a and 18b and which are disposed on virtual lines 19a, 19b connecting the centers of the rotational nodes 18a and 18b to the instantaneous center point 0 set at the lower end surface 30a of the pressing and heating tool 30 at a balanced state of the link mechanism, and a T-shaped rigid link 22 which is connected to the lower ends of the pair of rigid links 20a and 20b by means of rotational nodes 21a and 21b and whose lower end is fixed to the pressing and heating tool 30 so as to be rigidly integral with the lower end surface 30a of the pressing and heating tool 30. In the operation of this type of link mechanism, the three rigid links 20a, 20b and 22 are moved about the instantaneous center 0 in the vicinity of the balanced position thereof indicated by the solid line in FIG. 14.

In the above described arrangement, however, when the pressing and heating tool 30 is inclined to follow an inclination of the silicon chip 42, a translation occurs as indicated by the dashed line, thereby displacing the instantaneous center 0 to a point $0_1$. However, the mechanism shown in FIG. 14 approximating the mechanism shown in FIG. 15 to be explained hereinafter can be practically used for the die bonding apparatus because the heights of the bumps are in the order of several ten microns which are much smaller than the length of the IC chip in the order of several millimeters and because the inclination caused by the difference or variation in the heights of the bumps is very little.

Figure 15:
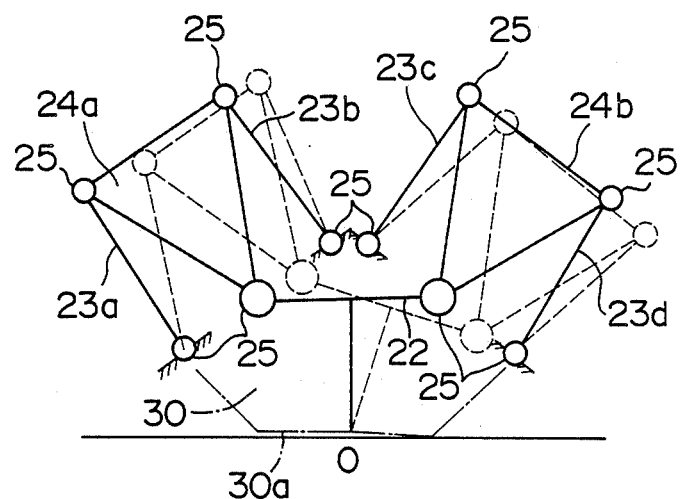
FIG. 15 is an explanatory view of another example of the principle of the remote center mechanism similar to the one of FIG. 14.

If it is desired to inhibit the above-mentioned displacement of the instantaneous center 0 while the rigid links moves about the instantaneous center 0, a ten-node link mechanism, such as shown in FIG. 15, having four rigid links 23a, 23b, 23c and 23d, a pair of rigid bodies 24a and 24b in the form of isosceles triangles, a T-shaped rigid link 22, and ten rotational nodes 25 may be applied.

In the case of this type of link mechanism, the position of the instantaneous center 0 is not displaced even when the four rigid links 23a, 23b, 23c and 23d, the pair of rigid bodies 24a and 24b in the form of isosceles triangles, the T-shaped rigid link 22 are moved about the instantaneous center 0 as indicated by the dashed line in FIG. 15.

An example of a pinching and pressing mechanism 74 having a link mechanism 50 with two remote center mechanisms in accordance with the principle shown in FIG. 14, in which each remote center mechanism is movable in one or another of two planes intersecting each other at right angles, will be now described in detail with reference to FIGS. 16 to 20.

A thermocompression bonding tool 51 is designed to press leads and IC bumps at its lower surface 52 provided as a pinching and pressing surface. A tool holder 54 is adapted for securely holding an upper portion 53 of the tool 51. The tool holder 54 is resiliently connected to an upper stage 60 of an intermediate block 59 by a pair of plate springs 56 whose central portions are disposed along lines radially extending from the center point 55 in the lower surface 52 of the tool 51, and corresponding pairs of plates 57 and screws 58 (rear side spring 56, plate 57 and screw 58 are in shown in the Figures). A lower stage 61 of the intermediate block 59 rigidly integral with the upper stage 60 is resiliently connected to a base 62 by a pair of plate springs 63 whose central portions are disposed along lines 75, 76 radially extending from the center point 55, and corresponding pairs of plate 64 and screws 65. A mount portion 66 of the base 62 is fastened to a vertical movement drive control stage (not shown) by screws 67 so that the base 62 can be displaced vertically. The intersections of each pair of lines such as lines 75, 76 may be preferred to be situated a little below the surface 52 in a case where the plate springs 63, 63 or 56, 56 are relatively weak for example, so that the instantaneous remote center can be situated on the surface 52.

When a pinching and pressing mechanism 74 having the orientation follow or adjustment mechanism 50 thus constructed is moved downwardly as indicated by the arrow E and when the lower surface 52 of the tool 51 is brought into contact with leads or IC bumps, a reaction force F to the tool 51 is produced. If, as shown in FIG. 16, the reaction F is applied at the center point 55 of the lower surface 52 of the tool 51, it does not cause any deflexion of the pairs of plate springs 56 and 63 in the orientation follow mechanism 50.

Figure 17:
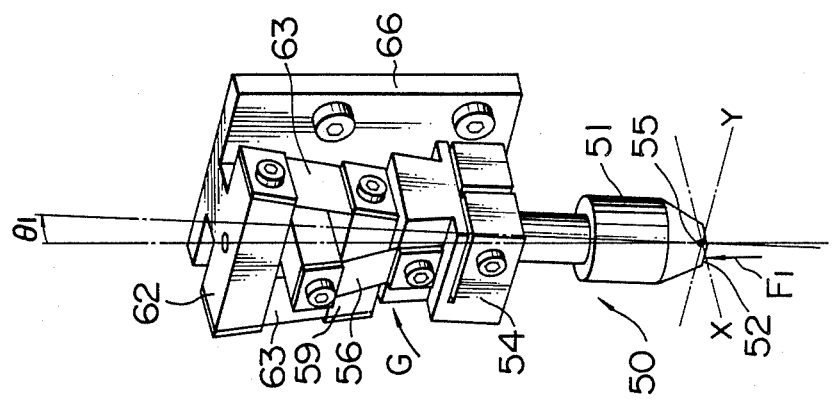
Figure 16:
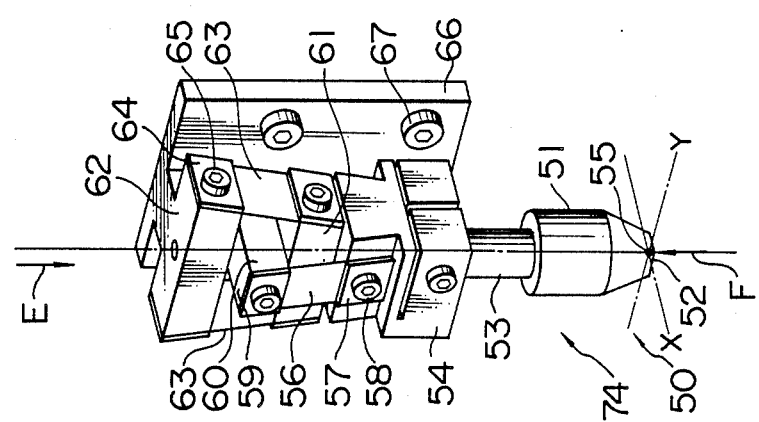
FIG. 16 is a perspective illustration of one of pinching and pressing mechanisms in a die bonding apparatus to which the principle shown in FIG. 14 is applied.

On the other hand, when the orientation mechanism 50 is initially substantially in the balanced position as shown in FIG. 16 and when a reaction $F_1$ is applied at a point deviated along X axis from the center point 55 of the lower surface 52 of the tool 51 as shown in FIG. 17, the pair of plate springs 56 space from each other in the X direction are deflected through the tool 51 and the tool holder 54 so that the tool 51 is turned about the center point 55 of the lower surface 52 of the tool 51 in a direction G and is inclined by an angle of $\theta_1$.

Figure 18:
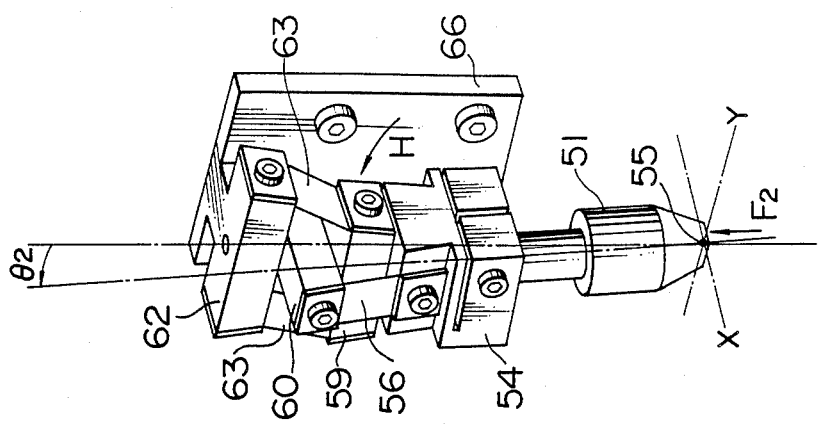
FIGS. 17 and 18 are perspective illustrations of different modes of the operation of the pinching and pressing mechanism shown in FIG. 16.

When the orientation mechanism 50 is initially substantially in the balanced position as shown in FIG. 16 and when a reaction $F_2$ is applied at a point deviated in Y direction from the center point 55 of the lower surface 52 of the tool 51 as shown in FIG. 18, the plate springs 63 spaced from each other in the Y direction are deflected through the tool 51, the tool holder 54, the plate springs 56 and the upper and lower stages 60 and 61 of the intermediate block 59 so that the tool 51 is turned about the center point 55 of the lower surface 52 of the tool 51 in the direction indicated by the arrow H and is inclined by an angle of $\theta_2$.

That is, when the bonding apparatus having the pinching and pressing mechanism 74 including the orientation mechanism 50 is initially substantially in the balanced state or position indicated in FIG. 19 and corresponding to that shown in FIG. 16 (at this time, the plate springs 63 are positioned on the lines 75, 76 radially extending for the point 55, their centers being aligned therewith), and when a force $F_2$ is applied to a point deviated from the center 55 in the Y direction as indicated in FIG. 20 and corresponding to that in the state shown in FIG. 18, the plate springs 63a and 63b are turned by $\theta_2$ about the portions (points in FIG. 20) 68 and 69 in a direction J. This angle generally corresponds to the angle of inclination of the tool 51 about the instantaneous center 55.

Thus, in the bonding apparatus having the pinching and pressing mechanism 74 including the orientation mechanism 50, the tool 51 can be turned about the center 55 of the lower surface 52 in all directions in accordance with the magnitude and the acting position of a reaction F applied at the lower surface 52 of the tool 51 serving as the pinching and pressing surface. Therefore, even if the heights of bumps or the thickness of tape leads on an IC chip to be bonded may be widely varied, it is possible to uniformly apply pressure to the contacts by inclining the lower surface 52 of the tool 51 in accordance with the inclination due to the variation, thereby enhancing the reliability of the electrical connections produced by the apparatus.

In case of the mechanism shown in FIGS. 16 to 20, the displacement of the instantaneous center in the horizontal direction is at most 1 $\mu$m for the vertical displacement of 10 $\mu$m, which will not cause any problem practically.

What is claimed is:

1. A die bonding apparatus for establishing electrical connection between a plurality of electrodes disposed on one side of a semiconductor chip and a plurality of associated electrodes on a package by pressing said electrodes against each other, said apparatus comprising: a pair of pinching and pressing mechanisms having a pair of pinching and pressing surfaces adapted to be moved closer relative to each other so as to pinch and press said semiconductor chip and said package therebetween; and at least one remote center mechanism provided in at least one of said pair of pinching and pressing mechanisms, in such a manner that a remote center thereof is positioned in the pinching and pressing surface of said one pinching and pressing mechanism, for adjusting orientations of the pinching and pressing surfaces to make said orientations correspond to those of both surfaces of said semiconductor chip and said package at the time of said pressing and pinching.

2. A die bonding apparatus according to claim 1, wherein said remote center mechanism has at least one parallelogram link mechanism in such a manner that the remote center is constantly positioned in the pinching and pressing surface of said one pinching and pressing mechanism.

3. A die bonding apparatus according to claim 2, wherein said remote center mechanism has a first pair of parallelogram link mechanisms operative in a first plane, each of said first pair of parallelogram link mechanisms being connected at its one side to a base of one of said pinching and pressing mechanisms and connected at a side, opposed to said one side, to a pinching and pressing portion on which said pinching and pressing surface of said one of said pinching and pressing mechanisms is formed.

4. A die bonding apparatus according to claim 3, wherein a second pair of parallelogram link mechanisms operative in second planes perpendicular to said first plane are connected to said opposed sides of said first pair of parallelogram link mechanisms.

5. A die bonding apparatus according to claim 1, wherein said remote center mechanism has at least one link mechanism adapted to have an instantaneous center thereof positioned in the pinching and pressing surface of said one pinching and pressing mechanism when said remote center mechanism is set substantially at or near a balanced position.

6. A die bonding apparatus according to claim 5, wherein said remote center mechanism has a first pair of link mechanisms operative in a first plane, each of said first pair of link mechanisms being connected at its one side to a holder and connected, at a side opposed to said one side, to a pinching and pressing portion on which said pinching and pressing surface of said one of said pinching and pressing mechanisms is formed.

7. A die bonding apparatus according to claim 5, wherein said remote center mechanism is constituted by a first link mechanism which is operative in a first plane and whose instantaneous center is positioned in the pinching and pressing surface of said one pinching and pressing mechanism when being substantially at or near a balanced position thereof, and a second link mechanism which is operative in a second plane perpendicular to said first plane and whose instantaneous center is positioned in one of said pinching and pressing surfaces when being substantially at or near a balanced position thereof.

8. A die bonding apparatus according to claim 7, wherein each of said link mechanism comprises a quadrilateral link mechanism constituted by two rigid body pieces having different lengths and two resilient pieces connected to said rigid pieces at corresponding ends thereof, and wherein the virtual line extended along longitudinal directions of said resilient pieces in each of said quadrilateral ink mechanism passing through the connected ends thereof intersect each other in the vicinity of said one of said pinching and pressing surfaces so that the instantaneous remote center thereof can be situated on said one surface.

* * * * *